(12) United States Patent
Moser et al.

(10) Patent No.: US 8,355,423 B2
(45) Date of Patent: Jan. 15, 2013

(54) VCSEL WITH NON-CIRCULAR MESA AND CURRENT CONFINEMENT APERTURE FOR HIGHER ORDER LATERAL MODE EMISSION

(75) Inventors: Michael Moser, Baden (CH); Sven Eitel, Zurich (CH); Wolfgang Kaiser, Zurich (CH)

(73) Assignee: Oclaro Technology Limited, Towcester (GB)

( * ) Notice: Subject to any disclaimer, the term of this patent is extended or adjusted under 35 U.S.C. 154(b) by 91 days.

(21) Appl. No.: 13/121,885

(22) PCT Filed: Sep. 30, 2009

(86) PCT No.: PCT/GB2009/051281
§ 371 (c)(1),
(2), (4) Date: Mar. 30, 2011

(87) PCT Pub. No.: WO2010/038067
PCT Pub. Date: Apr. 8, 2010

(65) Prior Publication Data
US 2011/0176572 A1 Jul. 21, 2011

(30) Foreign Application Priority Data
Sep. 30, 2008 (GB) .................................. 0817786.7

(51) Int. Cl.
*H01S 5/00* (2006.01)
(52) U.S. Cl. .............. 372/46.013; 372/46.01; 372/45.01
(58) Field of Classification Search ............. 372/46.013, 372/46.01, 45.01
See application file for complete search history.

(56) References Cited

U.S. PATENT DOCUMENTS

| | | | | |
|---|---|---|---|---|
| 5,724,374 | A | * | 3/1998 | Jewell ......................... 372/45.01 |
| 5,915,165 | A | * | 6/1999 | Sun et al. ......................... 438/47 |
| 5,978,408 | A | * | 11/1999 | Thornton ......................... 372/96 |
| 6,304,588 | B1 | | 10/2001 | Chua et al. |
| 6,411,638 | B1 | * | 6/2002 | Johnson et al. ............. 372/46.01 |

(Continued)

FOREIGN PATENT DOCUMENTS
EP 0858137 B1 8/1998
(Continued)

OTHER PUBLICATIONS

Choquette, Kent D. et al., "Transverse-mode engineering in vertical cavity-surface emitting lasers," Proceedings of the Conference on Lasers and Electro Optics, New York, IEEE, vol. 11:148-149 (2003).

(Continued)

*Primary Examiner* — Kinam Park
(74) *Attorney, Agent, or Firm* — Fenwick & West LLP

(57) ABSTRACT

A vertical cavity surface emitting laser (VCSEL) (100) has a substrate (104), on which are disposed first and second distributed Bragg reflectors (DBRs) (106, 112), each DBR comprising a stack of layers of alternating refractive index, an active layer (108) disposed between the DBRs, and an aperture layer (110) disposed either between the DBRs or within one of the DBRs. The aperture layer (110) has a border (116) having an internal boundary with a plurality of indented portions defining one or more apertures. Such a VCSEL is easily manufacturable and provides a narrow bandwidth output, as well as mitigating at least some of the problems of prior art VCSELs. Mesa (102) may be etched to be non-circular and subsequent selective oxidation of aperture layer (110) results in a non-circular current confinement aperture (114) promoting higher-order lateral modes (LP21).

14 Claims, 5 Drawing Sheets

U.S. PATENT DOCUMENTS

| | | | |
|---|---|---|---|
| 7,489,717 B2 * | 2/2009 | Baba et al. ................ | 372/45.01 |
| 2001/0050934 A1 | 12/2001 | Choquette et al. | |
| 2002/0141472 A1 | 10/2002 | Koyama et al. | |
| 2005/0100070 A1 | 5/2005 | Nakayama et al. | |
| 2008/0112442 A1 | 5/2008 | Ikuta | |

FOREIGN PATENT DOCUMENTS

| | | |
|---|---|---|
| EP | 0924822 B1 | 6/1999 |
| EP | 1208622 B1 | 5/2002 |
| EP | 1528647 A2 | 5/2005 |
| GB | 2442767 | 4/2008 |
| WO | 98/08280 A1 | 2/1998 |

OTHER PUBLICATIONS

Debernardi, Pierluigi et al., "Influence of Anisotropies on Transverse Modes in Oxide-Confined VCSELs," IEEE Journal of Quantum Electronics, vol. 38(1):73-84 (2002).

Great Britian Search Report for Application No. GB0817786.7, dated Feb. 2, 2009.

International Search Report for Application No. PCT/GB2009/051281, dated Dec. 7, 2009.

Ep Application No. 09 785 710.Jun. 2222 Official Action (May 24, 2012).

* cited by examiner

VCSEL WITH NON-CIRCULAR MESA AND CURRENT CONFINEMENT APERTURE FOR HIGHER ORDER LATERAL MODE EMISSION

RELATED APPLICATIONS

This application is a 35 U.S.C. 371 national stage filing of International Application No. PCT/GB2009/051281, filed Sep. 30, 2009, which claims priority to United Kingdom Patent Application No. 0817786.7, filed on Sep. 30, 2008 in the United Kingdom. The contents of the aforementioned applications are hereby incorporated by reference.

FIELD OF THE INVENTION

This invention relates to a vertical cavity surface emitting semiconductor laser, in particular such a laser in which the lasing of different transverse optical cavity modes is at least partially controlled, and a method for fabrication of such a laser.

BACKGROUND OF THE INVENTION

The vertical cavity surface emitting laser (VCSEL) has become an important light source within many technological fields, such as optical telecommunications and sensing. VCSELs are attractive since they can have low threshold currents, low power consumption and high quality far field patterns. Further, VCSELs can have a low manufacturing and testing cost due to their small wafer footprint and the ability to perform quality assessment at wafer scale.

The optical cavity of a VCSEL is typically short, and so it is inherently only capable of lasing on a single longitudinal mode of the laser's optical cavity. However, the transverse dimensions of the optical cavity are typically considerably larger than the length of the optical cavity. Consequently the emitted output beam may comprise a plurality of transverse modes, including a fundamental mode and higher order modes.

Different transverse modes of a VCSEL have different lateral extensions. Consequently, different transverse modes typically experience different round-trip cavity losses. Further the current density within the active layer is typically lower within the centre of the VCSEL than away from the centre. This can be particularly pronounced in VCSELs having both a top electrode with an emission window and a current injection aperture within the laser cavity that is narrower than the emission window. Consequently the optical gain within the active layer will be inhomogeneous, and different transverse modes will experience different levels of optical gain.

The round trip cavity losses and gains for different transverse modes determine which transverse mode or modes preferentially lase. The losses and gains vary with the current injection and ambient conditions of the VCSEL, and consequently which transverse modes lase can vary. The problem can be exacerbated by two further factors as laser drive current increases. Firstly, due to spatial hole burning the exitation of existing lasing modes will typically not increase in amplitude as quickly as other modes. Secondly, as new modes commence lasing and grow in excitation they may cannibalise existing lasing modes.

Different transverse modes lase at slightly different wavelengths, and consequently in uncontrolled or variable multimode operation the optical bandwidth of the VCSEL output is broader than in single mode operation. However, many VCSEL applications require a narrow optical bandwidth output. In particular the transmission of high data rate telecommunications signals requires narrow optical bandwidths in order to minimize the mode dispersion that occurs during transmission along lengthy optical fibres, which degrades the shape of the optical data signals carried by the light.

Furthermore when the VCSEL is able to lase in different transverse modes the operation can be unstable, with different transverse modes dominating the output under different operating conditions. This instability can introduce intensity noise into transmitted signals carried by the VCSEL. Consequently, there is a need to control the lasing behaviour of VCSEL modes.

The fundamental transverse cavity mode of a typical VCSEL has a circular cross-section and an intensity profile with a single central peak. By contrast the higher order transverse modes typically comprise an even number of peaks arranged around a ring in a pattern having n-fold rotational symmetry. These higher order transverse modes have a broader lateral extension than the fundamental mode. Consequently an approach to stabilising the output of a VCSEL and reducing its bandwidth is to introduce lateral attenuation elements into the laser cavity, which preferentially suppress the higher order modes with respect to the fundamental mode, to cause single fundamental transverse mode operation of the laser. Examples of such approaches include the designs disclosed in EP1276188 and EP1496583.

The lateral width of the fundamental transverse mode is narrow, which limits the optical output power that a single fundamental mode VCSEL is capable of producing. Consequently to achieve higher optical output powers it would be desirable to drive one or more higher order transverse modes of the VCSEL, whilst at least partially limiting the range of driven modes, thereby narrowing the output optical bandwidth compared with an unlimited design and reducing instability.

EP1835577 discloses a design of VCSEL comprising a pit that is etched into the centre of the upper reflector of the laser cavity. The pit modifies the reflectivity of the upper reflector of the laser cavity so as to preferentially suppress modes that optically overlap the pit, in particular the fundamental mode, thereby narrowing the bandwidth of the optical output.

However, the production of the etch pit of EP1835577 requires several additional lithographic processing steps within the VCSEL manufacturing process, such as photoresist deposition, photolithographic exposure, photoresist development, etching and resist removal. Such extra steps increase the complexity of the manufacturing process, and inaccuracies reduce the reliability and attendant yield of that manufacturing process.

U.S. Pat. No. 6,990,128 discloses an alternative design in which a surface of the laser cavity is selectively etched with a pattern of holes or grooves. The patterns of holes or grooves modify the reflectivity of the upper reflector of the laser cavity. The patterned reflectivity of the upper reflector suppresses transverse modes that optically overlap with the etched pattern, thereby preferentially enhancing a lasing mode in which the intensity profile corresponds with the gaps between the etched regions. Such a design seeks to enable a VCSEL to be driven on substantially a single higher order transverse mode.

However, the production of the etch pattern of U.S. Pat. No. 6,990,128 requires several additional lithographic processing steps within the VCSEL manufacturing process. Such extra steps increase the complexity of the manufacturing process, and inaccuracies reduce the reliability and attendant yield of that manufacturing process.

In particular variations in the dimensions and alignment of the etch pattern will affect the performance of the manufactured VCSELs.

Thus, there remains in the industry a need for an easily manufacturable VCSEL that provides a narrow bandwidth output, and which seeks to mitigate at least some of the problems of prior art VCSELs.

SUMMARY OF THE INVENTION

It is an object of the present invention to provide a vertical cavity surface emitting laser that seeks to overcome at least some of the disadvantages described above, and a method of making such a laser.

In accordance with a first aspect of the present invention, there is provided a vertical cavity surface emitting laser (VCSEL) comprising a substrate, on which are disposed first and second distributed Bragg reflectors (DBRs), each DBR comprising a stack of layers of alternating refractive index, an active layer disposed between the DBRs, and an aperture layer disposed either between the DBRs or within one of the DBRs, wherein the aperture layer has a border having an internal boundary with a plurality of indented portions defining one or more apertures.

In accordance with a second aspect of the present invention, there is provided a vertical cavity surface emitting laser (VCSEL) comprising a substrate, on which are disposed first and second distributed Bragg reflectors (DBRs), each DBR comprising a stack of layers of alternating refractive index, an active layer disposed between the DBRs, and an aperture layer disposed either between the DBRs or within one of the DBRs, wherein the aperture layer has a border having an internal boundary defining a plurality of apertures.

In accordance with a third aspect of the present invention, there is provided a method of manufacturing a VCSEL on a substrate, wherein the VCSEL comprises first and second DBRs, each DBR comprising a stack of layers of alternating refractive index, an active layer disposed between the DBRs, and an aperture layer disposed either between the DBRs or within one of the DBRs, wherein the aperture layer has an aperture provided within a border having an internal boundary with a plurality of indented portions, the method comprising partially oxidising the aperture layer to form the aperture therein.

In accordance with a fourth aspect of the present invention, there is provided a method of manufacturing a VCSEL on a substrate, wherein the VCSEL comprises first and second DBRs, each DBR comprising a stack of layers of alternating refractive index, an active layer disposed between the DBRs, and an aperture layer disposed either between the DBRs or within one of the DBRs, wherein the aperture layer has a aperture provided within a border having an internal boundary, the method comprising partially oxidising the aperture layer to form a plurality of apertures therein.

The cross-section of the internal boundary may be generally circular, or have a shape like leaflets of a clover-leaf, or may be shaped like a star with rounded corners.

The aperture may have n-fold mirror symmetry with respect to mirror planes passing through a centre and/or n-fold rotational symmetry about the centre, where n is an even number of 4 or more.

The VCSEL may comprise a mesa, the aperture layer may be disposed within the mesa and the border may have an external boundary coincident with an edge of the mesa. The external boundary may have n-fold mirror symmetry with respect to mirror planes passing through a centre and/or n-fold rotational symmetry about the centre, where n is an even number of 4 or more. The cross-section of the external boundary may be generally circular, or have a shape like leaflets of a clover-leaf, or may be shaped like a star with rounded corners.

The external boundary may have a plurality of indented portions. The indented portions of the internal boundary may correspond with grooves in a side wall of the mesa. The indented portions of the external boundary may correspond with grooves in a side wall of the mesa.

The gap between the internal and external boundaries may be of substantially uniform width.

The VCSEL may comprise a plurality of etch pits distributed around the aperture.

The aperture may be a current aperture and/or an optical aperture.

The aperture layer may comprise an oxidation layer, the aperture may comprise an unoxidised region of the aperture layer, and the border may comprise an oxidised region of the aperture layer. Alternatively the aperture and the border may comprise regions of the aperture layer having different tunnel junction properties.

The VCSEL may have an emission window within which an etched pattern may be provided. The etched pattern may have n-fold mirror symmetry with respect to mirror planes passing through a centre and/or n-fold rotational symmetry about the centre, where n may be an even number of 4 or more, and the mirror symmetry lines of the etched pattern may be aligned with mirror symmetry lines of the internal boundary.

BRIEF DESCRIPTION OF THE DRAWINGS

For a better understanding of the present invention and to show more clearly how it may be carried into effect, reference will now be made, by way of example only, to the accompanying drawings, in which.

DETAILED DESCRIPTION OF PREFERRED EMBODIMENTS

Figure 1:
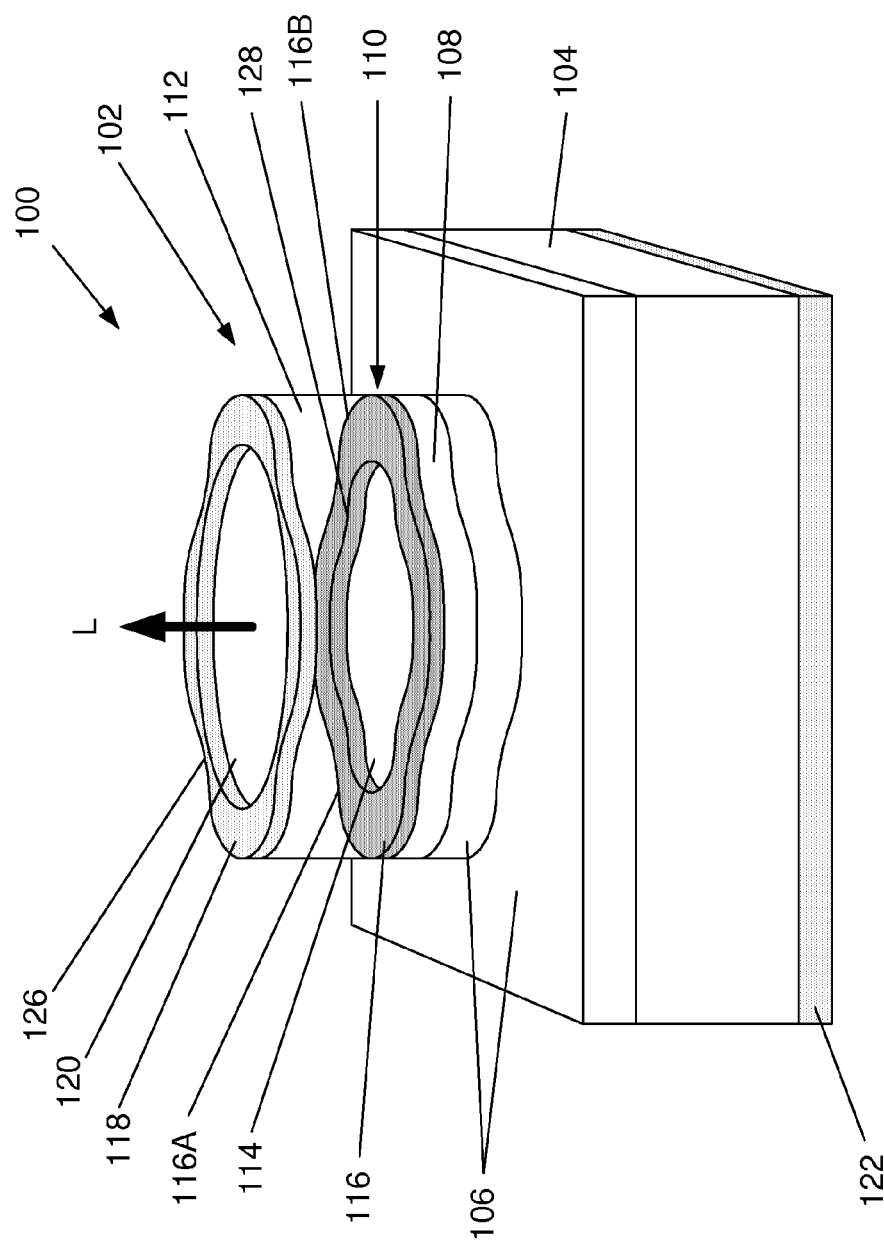
FIG. 1 is a schematic three-dimensional view of a first VCSEL according to the present invention

Referring to FIG. 1 of the accompanying drawings, a vertical cavity surface emitting laser (VCSEL) 100 according to an embodiment of the present invention is illustrated. The VCSEL 100 comprises a mesa 102 etched from a series of semiconductor layers deposited on a substrate 104. The mesa 102 is shown with sides that are perpendicular to the plane of the substrate, however, it is also known for the mesa to be tapered with inclined sides.

The semiconductor structure of the VCSEL 100 comprises the substrate 104, a first distributed Bragg reflector (DBR) 106, an active region 108, aperture layer 110 and a second DBR 112. The VCSEL is further provided with a top electrode 118 having an emission window 120 through which the output of the VCSEL is emitted, and a back electrode 122 on the opposite side of the substrate from the mesa 102. The electrodes 118 and 122 enable electrical connection to opposite sides of the active region 108, and comprise metallisations, as are known within the industry, such as Ti—Pt—Au. The emission window 120 may conveniently be circular, or may be shaped in correspondence with the mesa shape.

The VCSEL structure is grown on the substrate by one of the known epitaxial growth techniques, including, but not limited to, MBE and MOVPE. A brief description of the structure and manufacture of the VCSEL is given below. Further details concerning the epitaxial structure and growth of VCSELs with aperture layers can be found within the literature, including for example EP1276188 and EP1496583.

Figure 2:
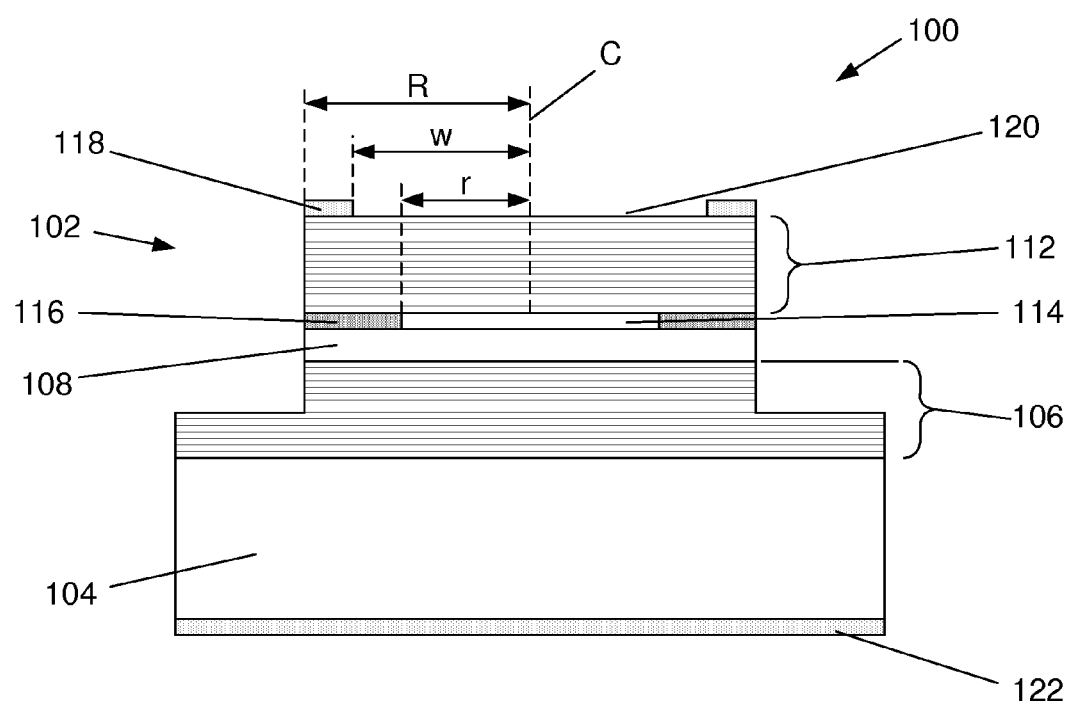
FIG. 2 illustrates a schematic cross-section through the VCSEL of FIG. 1, perpendicular to the substrate

In this example the substrate 104 is a GaAs substrate, and the structure described corresponds with the GaAs based material system. However, the use of other substrates and corresponding material systems are also know within the industry, such as the InP, GaP, GaSb and GaN material systems. The first and second DBRs 106 and 112 comprise a plurality of pairs of doped layers of alternating high and low refractive indices. The thickness of each pair of doped layers is equivalent to an optical path length of substantially a half the lasing wavelength of the VCSEL 100. The plurality of doped layers of the DBRs 106 and 112 are shown schematically in FIG. 2, which illustrates a cross-section through the VCSEL of FIG. 1. The DBRs 106 and 112 in this example are formed from AlGaAs layers with alternating chemical compositions. The laser active region 108 comprises a plurality of layers, and in this example comprises either a p-i-n or n-i-p structure, with corresponding doping of the DBR adjacent to the p- and n-doped sides of the active regions 108. The laser active region 108 will typically comprise a heterostructure and include quantum wells, although it will be appreciated that other restricted quantum effect structures may be used.

In the manufactured VCSEL 100, the aperture layer 110 comprises an aperture 114 that is substantially electrically conductive and a border 116 that is substantially electrically insulating. Consequently the aperture 114 constricts electrical current flow through the VCSEL. The border 116 has an internal boundary 116A and external boundary 116B.

The aperture 114 is substantially optically transparent having a first refractive index and a first optical path length. However, the border 116 has a different, second refractive index and a different, second optical path length. Consequently, light transmitted through the border 116 is out of phase with parallel light transmitted through the aperture 114. This results in light transmitted through the border 116 experiencing a lower reflectivity from a DBR 106 or 112 than for light transmitted through the aperture 114. Thus the border 116 provides an optical spatial filter, since transverse modes that optically overlap with the border experience preferentially increased optical losses.

At time of epitaxial growth the aperture layer 110 is not laterally patterned, and the border 116 is formed subsequently. At the time of epitaxial growth of the VCSEL of the present example, the aperture layer 110 comprises a semiconductor material having an increased proportion of aluminium relative to the remainder of the layers within the mesa, providing a high oxidation rate during a subsequent step in which the border is formed, as will be discussed below. In this example the oxidation layer is AlAs.

Figure 3:
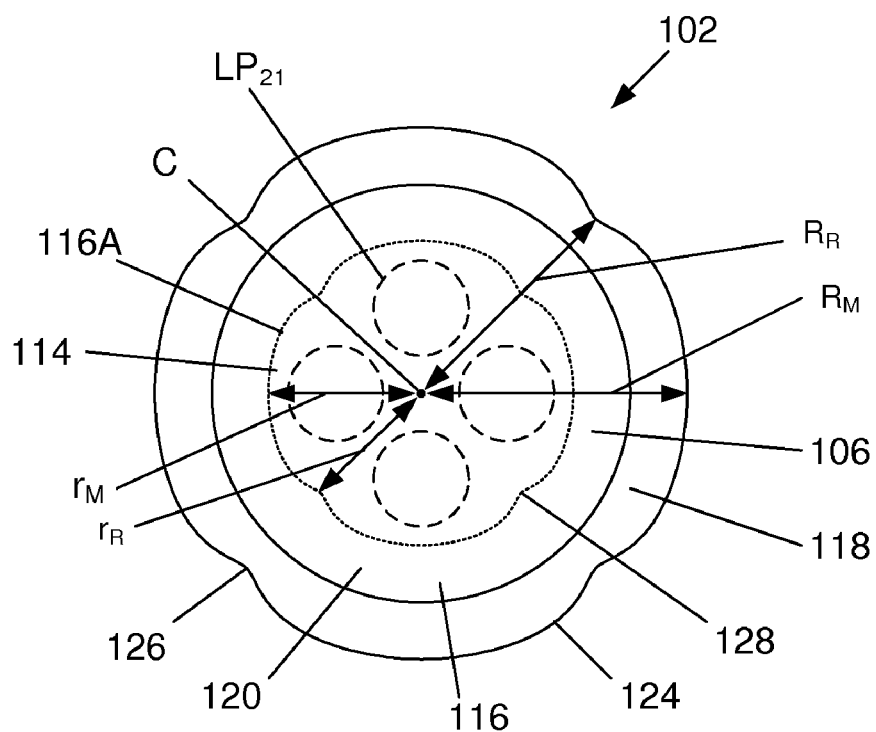
FIG. 3 illustrates a schematic plan view of the mesa of the VCSEL of FIG. 1

Following epitaxial growth of the semiconductor layers upon the substrate 104, an etch mask is created on the upper layer for use in selectively etching the layers to produce the mesa 102. The shape of the etch mask used will correspond with the desired cross-sectional shape of the mesa 102. The mesa 102 has a generally circular cross-sectional shape 124, being either generally cylindrical or generally conic. The mesa 102 is further provided with mesa indentations 126 running up the sides of the mesa. The mesa indentations 126 are more clearly apparent in cross-section, as illustrated in FIG. 3, which shows a plan view of the top of the mesa 102. The mesa indentations 126 may be shallow, or may be concave as illustrated. Consequently the periphery of the mesa 102 is non-circular, having a maximum mesa radius $R_M$ with respect to the centre C (corresponding with a central axis of the mesa), and portions of the periphery with a reduced mesa radius $R_R$ corresponding with the indentations 126. To produce a mesa 102 with mesa indentations 126, the shape of the corresponding mask feature should also be provided with indentations. Following deposition and patterning of the masking material, the semiconductor layers will be etched to the desired depth to form the mesa 102, which will include etching through the aperture layer 110 to expose its edge within the mesa. Suitable anisotropic etching processes are known in the industry.

Subsequent to the mesa etch step the aperture layer 110 within the mesa 102 is laterally patterned. In the present example a selective wet oxidation process is performed, in which a thickness of the aperture layer 110 adjacent to the surface of the mesa 102 is oxidised, such that the aluminium within the layer is converted to aluminium oxide. The size and shape of the aperture 114 formed is subject to the oxidation rate of the aperture layer, which is dependant upon the oxidation chemistry, the aluminium concentration, the oxidation time and the mesa shape. Due to the way in which the oxidation front progresses during oxidation, the aperture 114 will acquire a shape in correspondence with the cross-sectional shape of the periphery of the aperture layer 110 within the mesa 102. Accordingly, in the present example, the aperture 112 will also be provided with aperture indentations 128 in correspondence with the mesa indentations 126 in the side of the mesa 102. Consequently the aperture 112 will be non-circular, having a maximum aperture radius $r_M$ and portions of the aperture with a reduced aperture radius $r_R$.

In the present example the mesa has a maximum mesa radius of 14 um, a reduced mesa radius of 12 um within the indentations, and the aperture layer is oxidised to produce a border 8 um wide. Consequently the aperture has a maximum aperture radius of 6 um and indentations with a reduced aperture radius of 4 um.

In operation, a bias is applied between the top and back electrodes 118 and 122, producing a bias across the active region 108. The active region 108 is the gain region within the laser cavity of the VCSEL defined between the two DBRs 106 and 112. The emission window 120 has a window radius W. The aperture 114 is generally smaller than the emission window 120.

The shape of the aperture (or apertures) of the present invention patterns the current density within the active region 108 relative to a VCSEL having a complete rotational symmetry. In particular the current density is patterned in correspondence with the shape of the aperture 114. However, it is known that gain and refractive index are linked by the Kramers-Kronig relations. Accordingly, the refractive index within the mesa is modified in correspondence with the patterning of the current density. This leads to preferential gain guiding of corresponding transverse modes. The VCSEL may preferably be substantially gain guided.

The mesa 102 and corresponding aperture 114 of the VCSEL 100 of FIG. 1 have four-fold rotational and mirror symmetries, and the inhomogeneous current injection will also have such symmetries. Such a current injection will preferentially enhance the driving of a higher order transverse mode that also has such symmetries, for example the $LP_{21}$ mode. Further this preferential enhancement of certain modes can enable more stable driving of particular modes, reducing cannibalisation of one mode by another as drive current and ambient conditions change, thereby serving to stabilise the relative intensities of those particular modes of the laser. In particular, the indentations may serve to provide patterning of the current density within the active layer and/or the resistance experienced by current flowing through the active layer. This patterning is in correspondence with the optical intensities of selected optical modes. In particular the patterning can correspond with an optical mode that has a more centrally concentrated intensity, such as the fundamental mode. This can reduce the susceptibility of the selected mode or modes to cannibalisation by other modes.

Many modes of the laser may be excited, but to a lesser extent than the preferred modes. In particular preferential driving of a higher order mode and optical spatial filtering by the aperture will suppress other higher order modes, thereby reducing the bandwidth of the emitted signal with respect to a similar VCSEL with a circular aperture, and mode competition noise in the VCSEL output.

Figure 4:
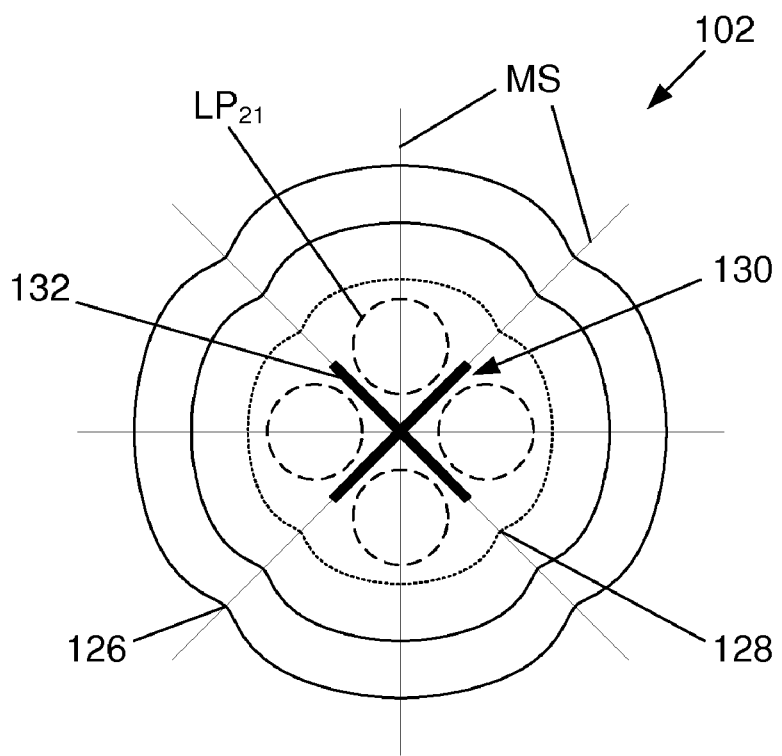
FIG. 4 illustrates a schematic plan view of a mesa of a second VCSEL according to the present invention provided with a etched pattern

Further spatial filtering of the transverse cavity modes can be provided by means of an etch pattern 130 etched into the top surface of the mesa with the emission window 120, as is illustrated in FIG. 4. The etch pattern can comprise a multi-legged star, as per the four-legged star shown. Alternatively another pattern having such rotational and mirror symmetries may be used, such as a pattern of etched dots. The legs 132 of the etch pattern 130 are aligned coplanar with those planes of mirror symmetry MS of the mesa 102 and aperture 112 that pass through the mesa indentations 126 and aperture indentations 128.

The etched regions of the etch pattern 130 provide a reduced reflectivity compared with the unetched regions, and consequently serve as a spatial filter that preferentially attenuates modes which do not have the same symmetry pattern as the etch pattern. Consequently the etch pattern 130 of FIG. 4 preferentially attenuates all modes except for a mode 134 with four-fold mirror symmetry, which is preferentially driven. In particular the centre of the etch pattern 130 corresponds with the centre of the fundamental mode, providing particularly acute attenuation of that mode.

Figure 5:
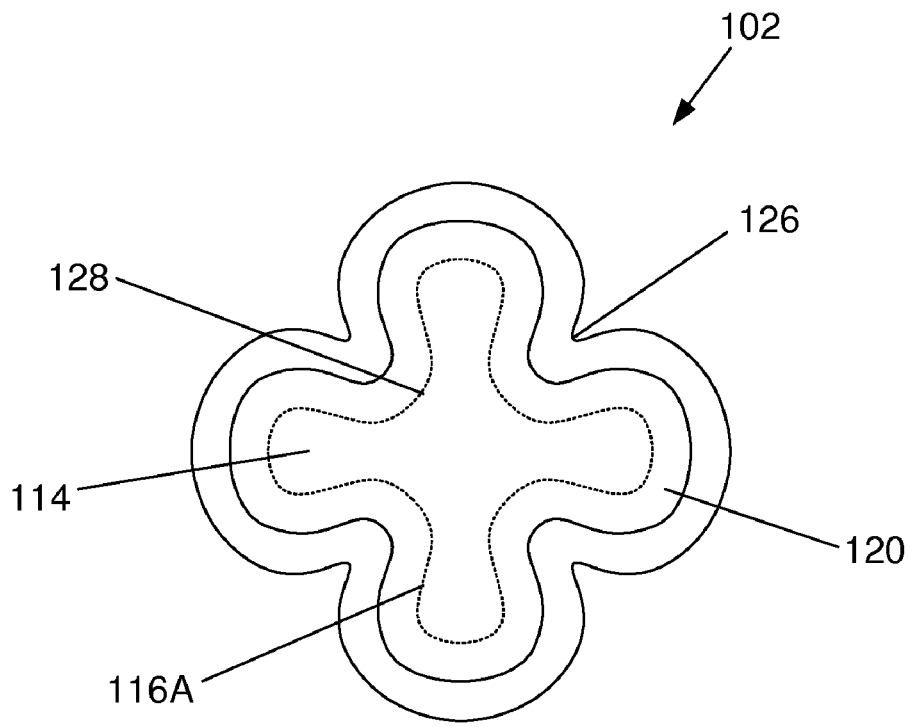
FIG. 5 illustrates a schematic plan view of a third VCSEL according to the present invention
Figure 6:
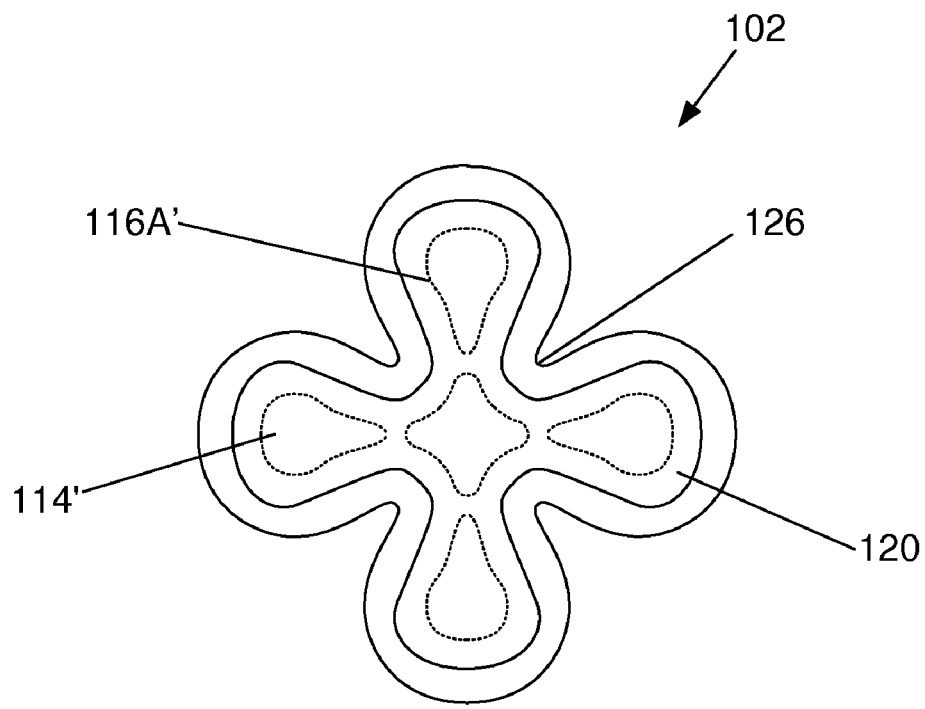
FIG. 6 illustrates a schematic plan view of a fourth VCSEL according to the present invention

FIGS. 5 and 6 illustrate plan views of mesas 102 of further VCSELs 100 according to the present invention, with more substantial mesa indentations 126 than in FIG. 1, resulting in mesas with a substantially cross-like or clover-leaf-like cross-sectional shape. Correspondingly, the aperture 112 of FIG. 5 has a more pronounced cross-like or clover-leaf-like shape than the aperture of FIG. 1. In the case of the FIG. 6, the mesa indentations 126 and border 116 are configured such that the aperture 112' comprises a plurality of separate apertures.

Figure 7:
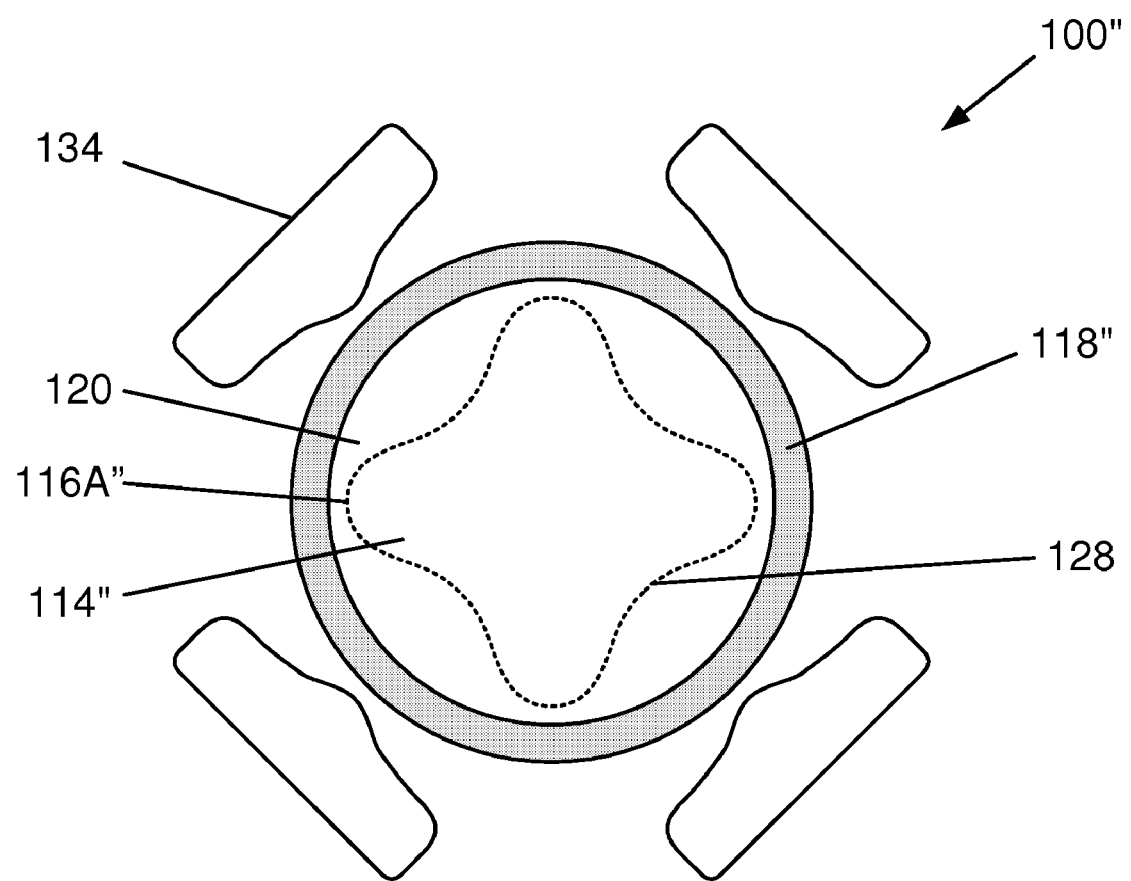
FIG. 7 illustrates a schematic plan view of a fifth VCSEL according to the present invention

FIG. 7 illustrates a further type of VCSEL 100" in which, rather than etching a mesa, a series of etch pits 134 are formed exposing an edge of the aperture layer, such that following an oxidation step an oxidised region forms in the aperture layer around each etch pit, and adjacent oxidised regions coalesce to produce a composite oxidised region. The composite oxidised regions provide a border within which an aperture 114" is defined, which has aperture indentations 128".

The accompanying figures illustrate only VCSELs having four-fold rotational and mirror symmetries that correspondingly, preferentially excite a higher order mode with corresponding symmetries, e.g. $LP_{21}$. However, it will be appreciated that the present invention may also be applied to devices having other orders of symmetry. For example the device may have only two-fold or six-fold rotational symmetry and respectively preferentially excite the $LP_{11}$ or $LP_{31}$ transverse mode, which have a peak intensity with corresponding two-fold or six-fold rotational symmetry.

Advantageously the symmetries of the aperture may be aligned with major crystallographic planes of the substrate.

Advantageously the VCSEL may also comprise a further aperture layer having a further aperture between the DBRs or within one of the DBRs. The further aperture would advantageously also be non-circular, being provided within a further border having a further internal boundary with a plurality of indented portions.

It will be appreciated that the present invention is also applicable to VCSELs that emit through the substrate and back of the device. Such VCSELs may be provided with an emission window within the back electrode, aligned with the VCSEL. It will also be appreciated that VCSELs according to the present invention may be provided with an electrode on the top surface of the wafer, surrounding the mesa, in place of the back electrode.

The invention claimed is:

1. A vertical cavity surface emitting laser (VCSEL) comprising:
   a substrate, on which are disposed first and second distributed Bragg reflectors (DBRs), each DBR comprising a stack of layers of alternating refractive index;
   an active layer disposed between the DBRs; and
   an aperture layer disposed either between the DBRs or within one of the DBRs;
   wherein:
   the aperture layer is disposed within a mesa having an external periphery comprising a plurality of indentations; and
   the aperture layer comprises a border in the plane of the layer having an external boundary coincident with the periphery of the mesa and an internal boundary defining one or more apertures, the one or more apertures having a shape in general correspondence with the external boundary, the shape configured so as to allow one chosen higher order mode and suppress other higher order modes of a signal emitted by the VCSEL and thereby reduce the bandwidth of the signal.

2. A VCSEL according to claim 1, wherein the cross-section of the internal and external boundaries are generally circular, have a shape like leaflets of a clover-leaf, or are shaped like a star with rounded corners.

3. The VCSEL according to claim 1, wherein the aperture and the external boundary of the mesa have n-fold mirror symmetry with respect to mirror planes passing through a centre and/or n-fold rotational symmetry about the centre, where n is an even number of 4 or more.

4. The VCSEL according to claim 1, wherein the indented portions of the internal and external boundaries correspond to grooves in a side wall of the mesa.

5. The VCSEL according to claim 1, wherein the gap between the internal and external boundaries is of substantially uniform width.

6. The VCSEL according to claim 1, wherein the aperture is a current aperture and/or an optical aperture.

7. The VCSEL according to claim 1, wherein the aperture layer comprises an oxidation layer, the aperture comprising an unoxidised region of the aperture layer and the border comprising an oxidised region of the aperture layer.

8. The VCSEL according to claim 1, wherein the aperture and the border comprises regions of the aperture layer having different tunnel junction properties.

9. The VCSEL according to claim 1, which has an emission window within which an etched pattern is provided.

10. The VCSEL according to claim 9, wherein the etched pattern has n-fold mirror symmetry with respect to mirror planes passing through a centre and/or n-fold rotational symmetry about the centre, where n is an even number of 4 or more, and the mirror symmetry lines of the etched pattern are aligned with mirror symmetry lines of the internal boundary.

11. A method of manufacturing a VCSEL, the method comprising:

growing on a substrate layers to form first and second DBRs, each DBR comprising a stack of layers of alternating refractive index, an active layer disposed between the DBRs, and an aperture layer disposed either between the DBRs or within one of the DBRs;

selectively etching the layers to produce a mesa having an external periphery comprising a plurality of indentations, and laterally patterning the aperture layer within the mesa by partial oxidation so as to produce a border having an external boundary coincident with the periphery of the mesa and an internal boundary defining one or more apertures having a shape in general correspondence with the external boundary, the shape configured so as to allow one chosen higher order mode and suppress other higher order modes of a signal emitted by the VCSEL and thereby reduce the bandwidth of the signal.

12. The method according to claim 11, wherein the aperture has n-fold mirror symmetry with respect to mirror planes passing through a centre and/or n-fold rotational symmetry about the centre, where n is an even number of 4 or more.

13. The method according to claim 11, wherein the aperture acquires the shape in correspondence with the cross-sectional shape of the external boundary due to the way an oxidation front progresses during the oxidation.

14. The VCSEL according to claim 4, wherein the aperture and the external boundary of the mesa have four-fold mirror symmetry with respect to mirror planes passing through the centre and/or four-fold rotational symmetry about the centre.

* * * * *